United States Patent [19]

Sendelweck

[11] Patent Number: 5,117,123
[45] Date of Patent: May 26, 1992

[54] DIODE SWITCH PROVIDING TEMPERATURE COMPENSATED D.C. BIAS FOR CASCADED AMPLIFIER

[75] Inventor: Gene K. Sendelweck, Indianapolis, Ind.

[73] Assignee: Thomson Consumer Electronics, Inc., Indianapolis, Ind.

[21] Appl. No.: 515,491

[22] Filed: Apr. 30, 1990

[51] Int. Cl.⁵ .................. H03K 17/56; H03K 17/74; H03K 5/00; H04N 5/268
[52] U.S. Cl. ...................... 307/239; 307/256; 307/259; 328/26; 358/181
[58] Field of Search ............ 307/239, 317.1, 254, 307/443, 270, 643, 256, 257, 259, 321; 328/26

[56] References Cited

U.S. PATENT DOCUMENTS

| | | | |
|---|---|---|---|
| 3,459,969 | 8/1969 | Jasper | 307/256 |
| 3,710,142 | 1/1973 | Yokoyama | 307/256 |
| 4,521,810 | 6/1985 | Nigborowicz et al. | 358/181 |
| 4,638,181 | 1/1987 | Deiss | 307/243 |

*Primary Examiner*—Stanley D. Miller
*Assistant Examiner*—Trong Phan
*Attorney, Agent, or Firm*—Joseph S. Tripoli; Peter M. Emanuel; Richard G. Coalter

[57] ABSTRACT

A diode is connected at a first electrode thereof to a source of input signal to be switched via a capacitor and is connected at a second electrode thereof via an output circuit to an output terminal. A bias control circuit, coupled to the diode, provides a first operating mode in which the diode is forward biased for coupling the input signal to the output terminal via the output circuit and provides a second operating mode in which the first electrode of the diode is DC isolated so that the diode rectifies the AC component of the input signal and in so doing generates a reverse bias for self-biasing the diode to a non-conductive condition.

5 Claims, 2 Drawing Sheets

DIODE SWITCH PROVIDING TEMPERATURE COMPENSATED D.C. BIAS FOR CASCADED AMPLIFIER

FIELD OF THE INVENTION

This invention relates to signal switching apparatus and particularly to apparatus of the kind employing cascaded switch sections for enhancing the off-state attenuation of high frequency signal components being switched.

BACKGROUND OF THE INVENTION

The attenuation provided by a switch when the switch is turned off ("off-state" attenuation) is an important figure of merit for a switching circuit and particularly so in applications where the signal to be switched contains significant amounts of high frequency energy. As an example, when switching between a number of video input signals for television apparatus (e.g., recorders, receivers, monitors, effects generators, etc.) it is important that the video input signal that is not selected be attenuated below a minimum level to avoid interference with the selected video input signal. Generally speaking, it would be desirable to attenuate the unselected video signal by at least 60 dB and preferably more. Such levels of attenuation at video frequencies are not easily achieved with conventional integrated circuit switches due, for example, to the presence of parasitic capacitances. For this reason various methods have been proposed for improving the off-state attenuation of integrated circuit switches. One such technique, described in the following two examples, is to connect switches in cascade so that their off-state attenuations are additive.

A first example of switch cascading for improved off-state attenuation is described by Nigborowicz et al. in U.S. Pat. No. 4,521,810 entitled VIDEO SOURCE SELECTOR which issued 4 Jun., 1985. In a specific embodiment of this switching circuit, an emitter follower is connected in cascade with an integrated circuit switch of the CMOS type and a clamping transistor is connected to the base of the emitter follower transistor and controlled to disable the emitter follower when the CMOS switch is opened. By this means the video signal being switched is attenuated both by the disabled emitter follower circuit and by the CMOS switch when the switch is turned off.

A second example of cascaded switching circuits is described by Deiss in U.S. Pat. No. 4,638,181 entitled SIGNAL SOURCE SELECTOR which issued 20 Jan. 1987. In a specific embodiment disclosed in the Deiss patent a diode switch is connected in series with a CMOS integrated circuit switch. The circuit includes a bias circuit that sends turn-on current through the CMOS switch to the diode switch when the CMOS switch is closed. Another bias circuit applies reverse bias to the diode switch when the CMOS switch is opened. For maximum off-state attenuation Deiss recommends the use of a diode of the p-i-n type as such diodes exhibit a very low junction capacitance and thus minimize parasitic coupling when the diode is off.

SUMMARY OF THE INVENTION

The foregoing two examples of cascaded video switches provide excellent attenuation performance. However, both examples are relatively complex requiring a clamping transistor or a source of reverse bias voltage for maintaining the off condition of the switch.

The present invention is directed, in a first respect, to providing a switch of the type employing a diode in which a separate source of reverse bias is not required for maintaining the switch in an off condition.

A switching circuit embodying the invention includes a diode having a first electrode connected by a DC blocking capacitor to a source of input signal to be switched and having a second electrode connected via an output circuit to an output terminal. A bias control circuit is coupled to the first and second electrodes of the diode for providing a first operating mode for forward biasing the diode when input signals are to be coupled to the output terminal and having a second operating mode for providing DC isolation of the first electrode of the diode so that the diode rectifies the AC input signal applied thereto and in so doing generates a reverse bias for turning the diode off.

In accordance with a further aspect of the invention the output circuit comprises a non-additive mixer.

In accordance with yet another aspect of the invention the output circuit includes an amplifier and a non-additive mixer.

BRIEF DESCRIPTION OF THE DRAWING

The invention is illustrated in the accompanying drawing wherein like elements are denoted by like reference designators and in which.

DETAILED DESCRIPTION

Figure 1:
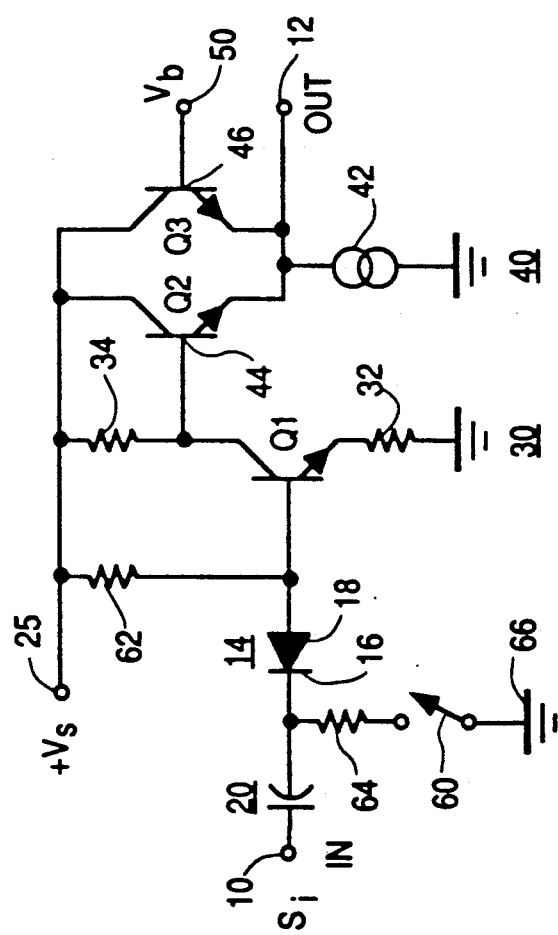
FIG. 1 is a circuit diagram of a switch embodying the invention.

The switching circuit of FIG. 1 includes an input terminal 10 for receiving an input signal Si to be switched and an output terminal 12 for providing a switched output signal. A diode 14 is provided having a first electrode 16 (cathode) coupled via a DC blocking capacitor 20 to the signal input terminal 10 and having a second electrode 18 (anode) coupled via an output circuit (30 and 40) to the output terminal 12. The output circuit comprises a cascade connection of an amplifier 30 and a non-additive mixer 40. Amplifier 30 comprises an NPN transistor Q1 having a base electrode connected to the second electrode (anode) 18 of diode 14, having an emitter electrode 32 coupled to a source of reference potential (ground) via an emitter resistor 32 and having a collector electrode coupled to a supply voltage input terminal 25 via a collector load resistor 34. A positive supply voltage Vs is applied to supply terminal 25. The non-additive mixer 40 comprises a pair of NPN transistors Q2 and Q3 having the collector electrodes thereof connected to the supply terminal 25 and having the emitter electrodes thereof connected to the output terminal 12 and coupled to ground via a current source 42. The current source may be implemented as a resistor or it may be a transistor biased to operate as a current source. The base electrode 44 of transistor Q2 serves as one input of the non-additive mixer 40 and is connected to the output of amplifier 30 at the collector of transistor Q1. The base electrode 46 of transistor Q3 serves as a second input of the non-additive mixer 40 and is connected to an input terminal 50. In this example of the invention a DC bias voltage Vb is applied to terminal 50. In a further example discussed later a second input signal to be switched is applied to input terminal 50.

The remaining elements of FIG. 1 comprise a bias control circuit for diode 14 for providing a first operating mode in which diode 14 is forward biased for coupling the input signal Si to output terminal 12 via amplifier 30 and non-additive mixer 40 and for providing a second operating mode in which the first electrode (cathode) 16 of diode 14 is DC isolated so that the diode rectifies the AC component of the input signal Si supplied via DC blocking capacitor 20 and in so doing generates a reverse bias voltage which "self-biases" diode 14 to an OFF (non-conductive) state. As will be explained, amplifier 30 and non-additive mixer 40 provide further attenuation of the input signal in response to the self-biasing conditions of diode 14. The bias control circuit comprises a first resistor 62 coupled between the supply terminal 25 and the second electrode (anode) 18 of diode 14 and a second resistor 64 coupled in series with a switch 60 between the first electrode (cathode) 16 and a source of reference potential shown here as being a ground point 66.

Operation of the switching circuit of FIG. 1 will first be described for the case where the control switch 60 is closed. For this condition a DC path exists between supply terminal 25 and ground 66 through resistors 62, diode 14, resistor 64 and switch 60. Current flow in this path has two effects. Firstly, it forward biases diode 14 and so diode 14 couples the AC component of the input signal Si to the base of transistor Q1 of amplifier 30. Secondly, resistors 62 and 64 and diode 14 form a potential divider which provides temperature compensated DC bias to the base of transistor Q1 which biases the transistor for linear operation. The temperature compensation effect results because voltage changes of the base-emitter junction voltage Vbe of transistor Q1 are accompanied by similar changes of voltage across the P-N junction of diode 14. Accordingly, in this mode of operation diode 14 serves the dual functions of (1) providing coupling of the AC component of input signal Si and (2) providing Vbe temperature compensation of transistor Q1 in amplifier 30.

Amplifier 30 amplifies the AC component of the input signal coupled via diode 14. The gain of amplifier 30 is given, to a good approximation, by the ratio of the collector and emitter load resistors 34 and 32, respectively. The resistors, in conjunction with the DC bias applied to the base of transistor Q1 also determine the quiescent collector voltage which is a factor to be considered in the operation of the following non-additive mixer stage 40. A preferred bias condition for amplifier 30 is one which provides an output signal voltage that is within a range defined by the supply voltage Vs applied to terminal 25 and the bias voltage Vb applied to terminal 50. Illustratively, one may select DC bias for amplifier 30 such that the output voltage is about three quarters of the supply voltage Vs and the bias voltage Vb may be selected to be about one-half of the supply voltage Vs. Of importance to the present invention is that the bias voltage Vb for the non-additive mixer 40 is less than the supply voltage Vs for amplifier 30 and that amplifier 30 is biased to a quiescent level between Vs and Vb. As an example, for a 12 volt supply amplifier 30 may be biased to provide a quiescent output voltage of 9 volts and the bias Vb applied to non-additive mixer 40 may be 6 volts.

The amplified signal at the output (collector Q1) of amplifier 30 is applied to transistor Q2 of non-additive mixer 40. Transistor Q3, being DC biased at a lower voltage than transistor Q2 as previously explained, is therefore turned off and transistor Q2 and current source 42 function as an emitter follower to couple the amplified output signal to output terminal 12.

Briefly summarizing the foregoing; closure of switch 60 forward biases diode D14 which then provides the dual functions of (1) coupling the AC component of signal Si to amplifier 30 and (2) generating a temperature compensated DC bias voltage for amplifier 30. Amplifier 30 amplifies the coupled signal and provides an output voltage at a DC level which reverse biases transistor Q3 of the non-additive mixer 40 and is coupled to the output terminal 12 via transistor Q2 operating as an emitter follower.

Operation of the switching current of FIG. 1 will now be discussed for the case where control switch 60 is OPEN. For this condition there is no DC path from the first electrode (cathode) 16 of diode 14 to any point in the switching circuit. The DC isolation of the first electrode (cathode) 16 of diode 14 has a number of significant effects on the circuit operation previously described. A first effect is that this condition enables diode 14 to rectify the AC component of input signal Si and store the rectified voltage on capacitor 20. The capacitor 20 is charged by current flow through resistors 62 and diode 14 when input signal excursions are lower than the anode voltage of diode 14 but there is no discharge path and so the accumulated charge reverse biases diode 14 thereby attenuating the input signal. A second effect of opening switch 60 is that resistors 62 and 64 no longer bias transistor Q1 of amplifier 30 for linear operation. Instead current flow through resistor 62 is completely diverted to the base of transistor Q1 and this current effectively overdrives transistor Q1 into a non-linear mode in which the transistor is at or at least near saturation. Full saturation is not essential. What is important to the present invention is that the DC bias for transistor Q1 be changed only enough to decrease the collector voltage to a level sufficient to reverse bias transistor Q2 in non-additive mixer 40. This level is any voltage less than the DC bias voltage Vb applied to terminal 50. When this occurs transistor Q2 is reverse biased and transistor Q3 operates in conjunction with current source 42 as an emitter follower to couple the bias signal Vb to output terminal 12. Accordingly, in this mode (switch 60 open) the input signal Si is attenuated by diode 14 (which generates its own turn-off voltage by rectifying the input signal) and by amplifier 30 and by non-additive mixer 40.

Figure 2:
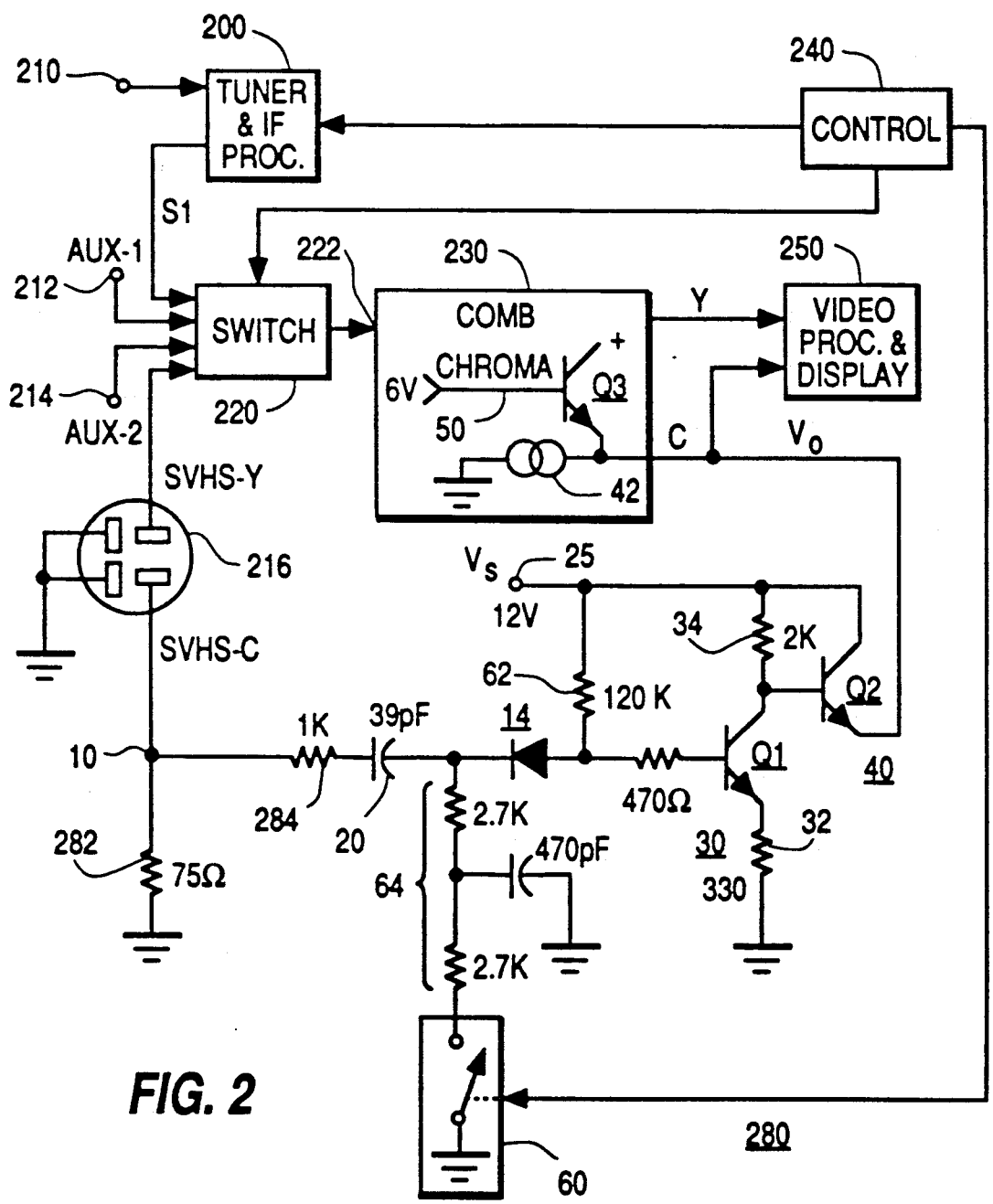
FIG. 2 is a block diagram, partially in schematic form, of a color television receiver embodying the invention including exemplary element values for the elements of the switch of FIG. 1 and including further features of the switch for the specific application shown and described.

FIG. 2 illustrates an application of the switching circuit of FIG. 1 for selectively switching two chrominance input signals in a color television receiver. This FIGURE also shows exemplary element values and voltages.

The color television receiver of FIG. 2 includes a tuner and IF processing unit 200 of conventional design having an input terminal 210 for receiving an RF modulated video input signal and an ouptut for providing a baseband demodulated video output signal. Other baseband composite video input signals are provided by auxiliary input connectors 212 and 214. An SVHS (super VHS) input connector 216 is provided for receiving a baseband video input signal of a separate luminance (SVHS-Y) and chrominance (SVHS-C) format. A four position selector switch 220 is provided for selectively coupling the signals S1, AUX-1, AUX-2 and SVHS-L to the input 222 of a comb filter 230. Channel selection for tuner 200 and signal selection by switch 220 is controlled by a control unit 240. The comb filter 230 has luminance (Y) and chrominance (C) outputs coupled to a video processing and display unit 250 of conventional design for processing and displaying color video images. The comb filter 230 is of a type having an emitter follower output stage for the chrominance signal. This stage is represented in comb filter 230 by transistor Q3 and current source 42 with the base of transistor Q3 biased at about 6 volts. It will be noted that these elements are identical to those used in non-additive mixer 40. Advantageously, the presence of an emitter follower in comb filter 230 eliminates the need for this element in ths SVHS chrominance switch 280 as will now be described.

The SVHS chrominance switch 280 corresponds to the switch of FIG. 1 with the following modifications. Firstly, an input signal terminating resistor 282 is provided between input terminal 10 and ground. This resistor terminates the SVHS chrominance signal provided by SVHS connector 216 in a standard characteristic impedance (75 Ohms). Electro-static discharge (ESD) protection is provided by an ESD protection resistor 284 connected in series with capacitor 20. The resistor 64 of FIG. 1 is implemented by a series connection of a pair of 2.7K-Ohm resistor having the common connection thereof by-passed to ground by a capacitor (470 Pico-Farads). This network functions as a low pass filter which provides the dual functions of (1) suppressing noise from switch 60 from entering the chrominance signal processing channel and (2) suppressing chrominance signals from entering switch 60 and thus interfering with other signals which may be switched by switch 60. Another change in this embodiment is the inclusion of a bare isolation resistor of 470 Ohms between the base of transistor Q1 and the anode of diode 14 for isolating parasitic capacitances associated with transistor Q1. Switch 60 is controlled by controller 240.

In operation control unit 240 selects signals for display by controlling switches 220 and 60. For example, when selecting video signals S1, AUX-1 or AUX-2 control unit 240 sends corresponding selection signals to switch 220 and simultaneously sends an inhibit signal to switch 60 which opens switch 60. This disables signal flow in the SVHS chrominance signal path as previously explained. Briefly reviewed, in this mode diode self-biases itself to an off state by rectifying the SVHS chrominance signal (if any is present), amplifier 30 is driven to saturation (or near saturation) and the non-additive mixer 40 selects the comb filter output signal. When the SVHS signal source 216 is selected by control unit 240 the switch 220 couples the SVHS luminance signal to processor 250 and the SVHS chrominance signal is coupled to processor 250 via diode 14, amplifier 30 and non-additive mixer 40 as previously explained in the description of FIG. 1.

What is claimed is:

1. A switching circuit comprising:
   a diode having a first electrode connected by a DC blocking capacitor to a source of input signal to be switched and having a second electrode coupled via an output circuit to an output terminal for providing a switched output signal; and
   a bias control circuit including a first resistor and a switch coupled in series between said first electrode of said diode and a source of reference potential and including a second resistor directly coupled between said second electrode of said diode and a source of supply voltage;
   said bias control circuit having a first operating mode responsive to a closed condition of said switch for forward biasing said diode for coupling said input signal to said output terminal;
   said bias control circuit having a second operating mode responsive to an open condition of said switch for providing DC isolation of said first electrode of said diode for causing said diode to rectify the AC component of said input signal applied thereto via said capacitor for producing a reverse bias voltage for said diode to thereby decouple said input signal from said output terminal and wherein said output circuit includes a cascade connection, in the order named, of an amplifier and a non-additive mixer, said amplifier having an input DC coupled to said second electrode of said diode, said non-additive mixer having a first input DC coupled to an output of said amplifier and a second input DC coupled to a source of bias voltage.

2. A switching circuit as recited in claim 1 wherein said non-additive mixer includes an input connected to an output of said amplifier and a further input to which a bias voltage is applied that is less than a supply voltage applied to said amplifier and said amplifier is biased to provide a quiescent output voltage between the values of said supply voltage and said bias voltage.

3. A switching circuit as recited in claim 1 wherein said diode in said first operating mode provides temperature compensated DC bias for said amplifier in said output circuit.

4. A switching circuit comprising:
   a diode having a first electrode connected by a DC blocking capacitor to a source of input signal to be switched and having a second electrode coupled via an output circuit to an output terminal for providing a switched output signal; and
   a bias control circuit including a first resistor and a switch coupled in series between said first electrode of said diode and a source of reference potential and including a second resistor directly coupled between said second electrode of said diode and a source of supply voltage;
   said bias control circuit having a first operating mode responsive to a closed condition of said switch for forward biasing said diode for coupling said input signal to said output terminal;
   said bias control circuit having a second operating mode responsive to an open condition of said switch for providing DC isolation of said first electrode of said diode for causing said diode to rectify the AC component of said input signal applied thereto via said capacitor for producing a reverse bias voltage for said diode to thereby decouple said input signal from said output terminal and wherein said diode in said first operating mode provides temperature compensated DC bias for an amplifier in said output circuit.

5. A switching circuit comprising:
   a diode having a first electrode connected by a DC blocking capacitor to a source of input signal to be switched and having a second electrode coupled via an output circuit to an output terminal for providing a switched output signal; and a bias control circuit including a first resistor and a switch coupled in series between said first electrode of said diode and a source of reference potential and including a second resistor directly coupled between said second electrode of said diode and a source of supply voltage;

said bias control circuit having a first operating mode responsive to a closed condition of said switch for forward biasing said diode for coupling said input signal to said output terminal;

said bias control circuit having a second operating mode responsive to an open condition of said switch for providing DC isolation of said first electrode of said diode for causing said diode to rectify the AC component of said input signal applied thereto via said capacitor for producing a reverse bias voltage for said diode to thereby decouple said input signal from said output terminal and wherein said output circuit includes an amplifier having an input DC coupled to said second electrode of said diode and wherein said diode in said first operating mode provides temperature compensated DC bias for said amplifier in said output circuit.

* * * * *